United States Patent
Mair et al.

(10) Patent No.: US 7,327,185 B2
(45) Date of Patent: Feb. 5, 2008

(54) SELECTABLE APPLICATION OF OFFSET TO DYNAMICALLY CONTROLLED VOLTAGE SUPPLY

(75) Inventors: Hugh Mair, Fairview, TX (US); Sumanth Gururajarao, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/264,404

(22) Filed: Nov. 1, 2005

(65) Prior Publication Data

US 2006/0091385 A1    May 4, 2006

Related U.S. Application Data

(60) Provisional application No. 60/624,429, filed on Nov. 2, 2004.

(51) Int. Cl.
G05F 1/575    (2006.01)
(52) U.S. Cl. .................. 327/540; 327/544; 365/227; 700/298
(58) Field of Classification Search .................. None
See application file for complete search history.

(56) References Cited

U.S. PATENT DOCUMENTS 7,131,089 B2 * 10/2006 Issa et al. .................. 716/6
7,148,755 B2 * 12/2006 Naffziger et al. .............. 331/16
2005/0194592 A1    9/2005 Mair et al.

FOREIGN PATENT DOCUMENTS

WO    WO2005/089115 A2    9/2005

* cited by examiner

Primary Examiner—Kenneth B. Wells
Assistant Examiner—Terry L. Englund
(74) Attorney, Agent, or Firm—Dolly Y. Wu; W. James Brady; Frederick J. Telecky, Jr.

(57) ABSTRACT

An electronic system comprises a plurality of circuit paths. Each path in the plurality of circuit paths is coupled to receive a system voltage from a voltage supply. The system further comprises a first circuit for providing a first value indicating a first potential capability of operational speed of at least one path in the plurality of circuit paths and a second circuit for providing a second value for indicating a second potential capability of operational speed of the at least one path in the plurality of circuit paths. The system further comprises circuitry for adjusting the system voltage, as provided by the voltage supply, in response to a relation between the first value and the second value.

35 Claims, 6 Drawing Sheets

SELECTABLE APPLICATION OF OFFSET TO DYNAMICALLY CONTROLLED VOLTAGE SUPPLY

CROSS-REFERENCES TO RELATED APPLICATIONS

This application claims priority under 35 U.S.C. § 119 of U.S. Provisional Application No. 60/624,429, entitled, "Beta-Adjusted VDD For Closed Loop Voltage Power Supply Applications With Integrated SRAMs," filed Nov. 2, 2004.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to selectable application of an offset to a dynamically controlled voltage supply.

Electronic circuits are prevalent in numerous applications and are used in devices in personal, business, and other environments. Demands of the marketplace affect many design aspects of these circuits, including device size, complexity, efficiency, performance, and cost. These aspects are often important in various devices. By way of example, the mobile phone industry is transitioning from devices that are voice oriented to devices that are multimedia oriented, and multimedia applications typically integrate high performance processing cores. As a result, the above-mentioned aspects of size, complexity, efficiency, performance, and cost manifest themselves in various areas, including energy consumption, speed capability, and battery lifetime. These areas are also a concern in various other electronic devices, particularly where energy is a concern such as in other battery-powered applications. Thus, to maintain pace with marketplace demands and supplier goals for these devices, considerations with respect to these factors are of paramount interest.

With the developments described above, integrated circuit, or "chip", design in the current state of the art often uses various criteria to determine a nominal level of voltage supply for the device, with a corresponding clock speed specification then determined from that nominal voltage supply. For example, some manufacturers develop a yield distribution curve, often in the shape of a Gaussian distribution (i.e., bell curve). Due to manufacturing variations, each chip in a group of chips will fall somewhere along this curve in terms of the quality of the overall silicon of the device. With this curve, for purposes of developing a speed specification for the entire group of chips, the weakest acceptable device is then tested with a power supply providing a pin-level voltage at which the device is predicted to perform over an acceptable period of time. For example, in current technology, such voltage may be on the order of 1.2 volts for a device, such as a digital signal processor, to operate reliably for a predicted period of seven years (where the use of seven years is only by way of example). This voltage, often referred to as the nominal voltage, is typically determined from various attributes of the device, such as the voltage susceptibility of the transistor gate oxides (or insulators) on the chip, as is often constrained by the gate oxide thickness. Thus, this nominal voltage becomes a constraint on the amount of voltage applied to all chips in the group.

Also in connection with determining a nominal voltage supply, the prior art recognizes that the chip's voltage supply typically is a device external from the chip, and that voltage supply has a corresponding level of tolerance. For example, a voltage supply may be said to provide 1.2 volts, with a tolerance of 10%. Thus, the actual voltage provided by the supply may be anywhere in the approximate range of 1.08 volts to 1.32 volts. Accordingly, with the above voltage application and speed specification procedure, often the chip designer is required to assume a worst case scenario in terms of potential supply voltage, meaning in the present case the minus 10% voltage tolerance and a resultant output of the voltage supply of only 1.08 volts. In another respect, the prior art approach contemplates voltage loss between the power supply and the ultimate transistors of the chip's processing core(s). For example, the voltage supply as provided external from the chip traverses conductors between the voltage supply and the chip and they impart line losses due to the various attributes of the conductor lines (e.g., trace resistance and their tolerances). As another example, there may be line losses and tolerances internal to the chip, where those losses are incurred as the voltage is routed from the chip's external pins to the transistors of the chip's processing core(s). As still another example, temperature variations may cause a resistance change and, hence, a change in the voltage that ultimately reaches the chip's processing core(s).

As a result of the preceding, in part of the prior art the designer that is to determine a clock speed specification for a chip is often required to account for the worst case scenario for all of the possible voltage losses, by testing the corresponding chip core at a supply voltage level that includes all those losses. For instance, with a nominal voltage of 1.2 volts, then with these additional considerations there could be a worst-case-scenario loss of 0.2 volts before that nominal voltage reaches the processing core(s), coupled with the example above of 10% (i.e., 0.1 volt) loss from the power supply tolerance. In this case, only 0.9 volts actually reaches the processing core(s). Thus, the designer applies this worst-case 0.9 volts directly to the chip core and evaluates the speed of operation that the core can reliably provide at that voltage. Of course, this speed will be less than that which would be achieved in an ideal (i.e., lossless) case, where 1.2 volts would be applied to the core. Thus, this resulting test-speed becomes the specification speed for the device. Hence, assuming the device is then used properly per its specification, it is thereafter implemented into a system by a vendor, installer, OEM or the like, and clocked at this worst-case speed while connected to the corresponding nominal voltage (e.g., 1.2 volts). Lastly, note that in one approach, a voltage supply with a smaller tolerance may be used so as to gain back some of the difference in test-confirmed clock speed as between the ideal case and the higher tolerance case, but of course a lower tolerance voltage supply is more costly and thereby increases the overall system cost.

As yet another consideration with respect to the preceding, note that the prior art worst-case-scenario approach is often used to define the nominal voltage and test-confirmed clock speed as specifications for all chips in a group. More particularly, once the required nominal voltage is determined, it is applied to the weakest chip in the group and the speed attainable at that voltage becomes the specification speed for that chip. However, in the prior art, often this worst-case performance is then used as a limit for all chips in the same group as the weakest chip. Thus, chips in the same group, but that are better silicon than the weakest silicon device or that incur lesser losses than that anticipated in the worst-case scenarios, are necessarily constrained to perform at the test-confirmed clock speed in response to the nominal voltage as determined based on worst case conditions including the lesser performing chip. Thus, the above-described limitations are imposed on entire groups of chips rather than just single tested chips.

In view of the above, certain patent applications describe various improvements to the prior art. For example, U.S. application Ser. No. 11/139,452, entitled "Integrated Circuit With Dynamically Controlled Voltage Supply", was filed May 27, 2005 and is incorporated herein by this reference. With respect to U.S. patent application Ser. No. 11/139,452, it describes, among other things, an integrated circuit with a core as well as a speed capability indicator circuit that mimics a part of the core and in doing so produces an output signal that demonstrates a potential clock speed at which the core could operate at the present supply voltage. If that potential clock speed is higher than the actual core clock speed, it is recognized that in effect the voltage then being provided to the core is in excess of what they core truly requires to operate at the current actual clock speed, since the mimic circuit is able to achieve a faster speed at the same voltage. Thus, a detailed controller in the referenced application may dynamically adjust the system voltage, by lowering the system bias voltage and/or raising the system back bias voltage, thereby permitting the core to remain operating properly at its actual clock speed while using less power as provided from the adjusted system bias voltage(s). As another example, U.S. application Ser. No. 11/045,222, entitled "Adaptive Voltage Control For Performance And Energy Optimization", was filed Jan. 28, 2005 and is also incorporated herein by this reference. With respect to U.S. patent application Ser. No. 11/045,222, it describes, among other things, an integrated circuit chip that includes a reflex module, and that module includes speed capability indicator circuits or tracking elements in the form of a NAND oscillator and a NOR oscillator. Each oscillator provides a respective oscillator frequency in response to factors influencing the entire chip (e.g., voltage, process or manufacturing factors, temperature, leakage), thereby indicating the effect of those factors on the oscillators as well as how those effects impact the remainder of the chip. If the oscillator frequencies differs from the critical path frequency, possibly with scaling that is achieved by way of multipliers, then a dynamic adjustment in system voltage may be made based on that difference and thereby providing more efficient operation. Note in this latter case that the NAND oscillator is more sensitive to the effect of the environmental factors as they influence NMOS devices on the chip, and the NOR oscillator is more sensitive to the effect of the environmental factors as they influence PMOS devices on the chip.

By way of further background, the present inventors have recognized that a portion of the core in many contemporary integrated circuits typically includes a memory, and more particularly in many instances the memory includes static random access memory ("SRAM"). As known in the memory art, SRAM is a type of memory that is faster and more reliable than the more common dynamic RAM ("DRAM"), and the data stored in SRAM does not need to be refreshed like it does in DRAM. With the recognition of SRAM in a core, the present inventors also have discovered a potential drawback in the application of the above-introduced dynamically adjustable voltage systems to SRAM. Specifically, the above-described dynamic voltage approaches are well-suited for CMOS devices. However, many SRAMs do not operate in the traditional sense of CMOS and as such there are considerations that differ with respect to dynamically altering the SRAM voltage supply. Specifically, in typical CMOS operation, either a p-channel transistor is enabled and provides a voltage in one state of operation while a complementary n-channel transistor is disabled, or an n-channel transistor is enabled and provides a voltage in another state of operation while the complementary p-channel transistor is disabled. In contrast, in an SRAM typically a larger periphery n-channel transistor is connected to each bit line and is required when writing to an SRAM cell to in effect overpower an enabled p-channel transistor in the cell so as to discharge the drain of that p-channel transistor, only after which if successfully discharged is the p-channel transistor is then disabled. Moreover, in the case of the larger n-channel transistor, the difference between the cell supply voltage and the n-channel transistor source voltage must be sufficiently large so as to leave a sufficient voltage above the lower cell supply voltage (e.g., ground) to achieve this discharge, that is, to trip the state of the cell. This difference is affected when applying one of the above-described dynamically adjustable voltages to the n-channel transistor gate and, indeed, in some cases it has been observed that a source voltage of less than ground would be theoretically required to trip the cell for certain dynamically adjustable voltages at the transistor. However, such below-zero source voltages are unacceptable given that the source voltage is in fact tied to ground; thus, a measure is defined as the minimum voltage required at the source terminal of the larger n-channel write transistor and at which the bit cell trips, and this minimum voltage is referred to herein as the device's trip voltage, or $V_{trip}$. In current state of the art technology in the area of 100 nm CMOS devices, then the supply voltage is approximately 1.2 volts at the pins of the chip, which typically translates to a supply of approximately 1.08 volts at the SRAM cell transistors. Thus, there is only 1.08 volts across the CMOS cell transistors relative to ground, and if dynamically adjustable voltages are applied to the gate of the above-described n-channel transistor, then as observed there is the possibility for these relatively low voltage supply values that the cell will not trip state.

Given the preceding, it has been recognized in connection with the present inventions that if one of the above-introduced dynamic voltage changing approaches is implemented in connection with the cells of an SRAM, then there is the possibility that the system voltage may be adjusted to a level that jeopardizes the satisfying of the $V_{trip}$, which could therefore cause inoperability of an SRAM. Accordingly, there is a need to further improve aspects relating to circuit and device performance control and energy efficiency with respect to SRAMs and the circuits in which they are included, such as device cores. The preferred embodiments are directed to such improvements.

BRIEF SUMMARY OF THE INVENTION

In one preferred embodiment, there is an electronic system. The system comprises a plurality of circuit paths. Each path in the plurality of circuit paths is coupled to receive a system voltage from a voltage supply. The system further comprises a first circuit for providing a first value indicating a potential capability of operational speed of at least one path in the plurality of paths and a second circuit for providing a second value for indicating a potential capability of operational speed of the at least one path in the plurality of paths. The system further comprises circuitry for adjusting the system voltage, as provided by the voltage supply, in response to a relation between the first value and the second value.

Other aspects are also disclosed and claimed.

DETAILED DESCRIPTION OF THE INVENTION

Figure 1:
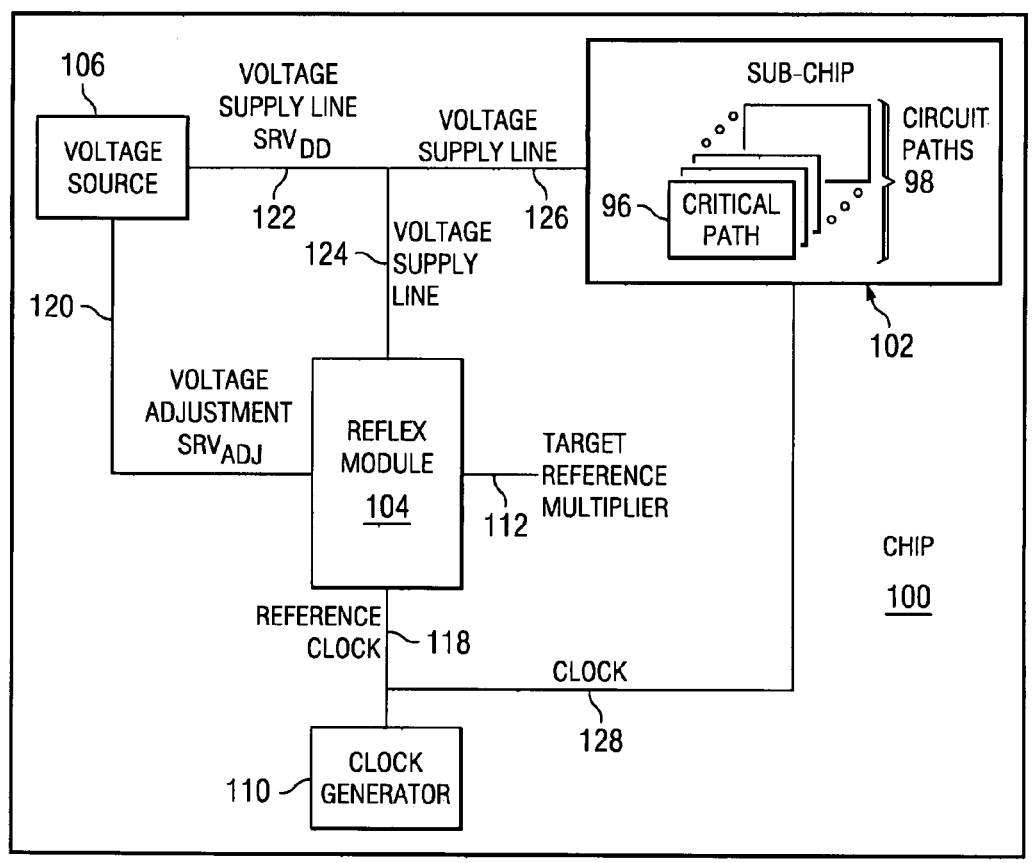
FIG. 1 shows an exemplary embodiment of a chip 100 per the preferred embodiments.

FIG. 1 shows an exemplary embodiment of a chip 100 per the preferred embodiments. Chip 100 comprises a "sub-chip" 102 that is preferably integrated on chip 100 and is an operation-performing port, such as a core, to accomplish various desired processes, tasks, or the like. Sub-chip 102 includes a reflex module 104, a voltage source 106, and a clock generator 110. Sub-chip 102 may be any portion of the circuitry of chip 100 and may perform some specific function(s) such as various processing functionality associated with a device core. Sub-chip 102 also may be a chip that is separate from chip 100, wherein sub-chip 102 is stacked upon chip 100. Circuit paths 98 preferably comprise a critical path 96 of sub-chip 102, where a critical path is identifiable in a core or circuit as is known in the art, such as through the use of various diagnostic software during the development of the core design. Typically, a critical path provides the most restrictive bottleneck to the data processing of a given circuit. Circuit paths 98 also may comprise any other path of circuitry on sub-chip 102, and for reasons more clear later one set of notable ones of these paths are those through a memory, and more particularly through a static random access memory ("SRAM"). Further, circuit paths 98, including critical path 96, may comprise a plurality of transistors arranged in a predetermined format. Voltage source 106 and clock generator 110 are not necessarily located on chip 100. Further, voltage source 106 supplies a voltage, referred to herein as $SRV_{DD}$, to sub-chip 102 by way of voltage supply lines 122 and 126 and to reflex module 104 by way of voltage supply lines 122 and 124. As detailed later, reflex module 104 adaptively or dynamically controls the $SRV_{DD}$ voltage output of voltage source 106 by sending a signal $SRV_{ADJ}$ to voltage source 106 via a voltage adjustment line 120. Clock generator 110 supplies a clock signal 128 to circuit paths 98 so as to govern their operational speed, and this same signal (or a scaled version thereof) is provided as a reference clock signal 118 to reflex module 104. Reflex module 104 also is supplied with a target reference multiplier ("TRM") signal 112, which may be a single multiplier value or as detailed further below may be more than one such value. TRM is used to scale the reference clock 118, or multiple TRMs are used to provide multiple scalings of the clock, to provide an indicator(s) of a desired speed of operation for any of circuit paths 98, including critical path 96, and that indicator is then used for a basis of comparison by reflex module 104 to determine if it should change $SRV_{ADJ}$ on voltage adjustment line 120 so as to change the voltage supply to those paths so as to efficiently support power consumption at this desired speed of operation.

The operation of chip 100 in connection with the components illustrated in FIG. 1 is now described in general with still additional details provided later in this document. Also, one skilled in the art should appreciate that various other functions may be performed by chip 100 but are not discussed herein so as to focus on various inventive aspects. At a given time, voltage source 106 is supplying voltage, and clock generator 110 is providing a clock signal 128, to sub-chip 102 and its circuit paths 98. Thus, ideally those paths operate at the frequency established by clock signal 128. However, reflex module 104 is included so as to make adjustments that may improve operational efficiency. Certain examples of such adjustments are provided below.

In one example of an adjustment achieved by reflex module 104, it determines from its tracking elements, described later, that circuit paths 98 (or critical path 96 therein) may operate at the current clock speed using less voltage or power. As a result, reflex module 104 presents a change in $SRV_{ADJ}$ on voltage adjustment line 120 to voltage source 106, and in response voltage source 106 reduces the power provided to circuit paths 98 via supply lines 122 and 126, where this reduction may be achieved in some embodiments by reducing the system voltage $SRV_{DD}$ and/or increasing a back bias voltage, which in either case provides less power consumption by sub-chip 102. For sake of simplification in the rest of this document, the reduction of power consumption will be referred to as achieved only by reducing the system voltage $SRV_{DD}$, but one skilled in the art should appreciate that an increase in the back bias voltage may be optionally implemented in various instances.

In another example of an adjustment achieved by reflex module 104, it determines from its tracking elements, described later, that circuit paths 98 (or critical path 96 therein) may not operate well at the current clock speed given the present amount of voltage supplied by voltage source 106. In this case, reflex module 104 presents a change in $SRV_{ADJ}$ on voltage adjustment line 120 to voltage source 106, and in response voltage source 106 increases the power provided to circuit paths 98 via supply lines 122 and 126, where this increase may be achieved in some embodiments by increasing the system voltage $SRV_{DD}$, which while increasing power consumption by sub-chip 102 also provides sufficient margin so that critical path 96 operates properly.

In still another example of an adjustment achieved by reflex module 104, it may determine a manner of efficiency for an upcoming change in operation. Toward this end, TRM 112 may be a set to a value to indicate a desired speed of operation for circuit paths 98, where in a preferred embodiment TRM 112 is a multiplier times the present reference clock signal 118. For example, if the present clock signal 128 is 100 MHz, the TRM 112 may be set to a value of two and as a multiplier times the present clock signal yields a target reference frequency ("TRF") of 200 MHz (i.e., present rate times TRM=100 MHz*2=200 MHz). In this case, reflex module 104 asserts $SRV_{ADJ}$ to increase the system voltage $SRV_{DD}$ until its tracking elements indicate that they may operate satisfactorily at this TRM of 200 MHz. With that indication, reflex module 104 is informed then that this same increased voltage should support the operation of circuit paths 98 (or at least critical path 96 therein) may also operate at the desired TRM of 200 MHz. Accordingly, at this point clock generator 110 increases its clock signal 128 to the desired TRM of 200 MHz, with a voltage adjustment already having been made to support that speed of operation. Finally, note that in connection with the adjustment of the present example, the two preceding examples also may then be applied, thereby further refining the level of system voltage supplied so as to establish an efficient amount of power consumption to support the then-existing clock speed of sub-chip 102.

Figure 2:
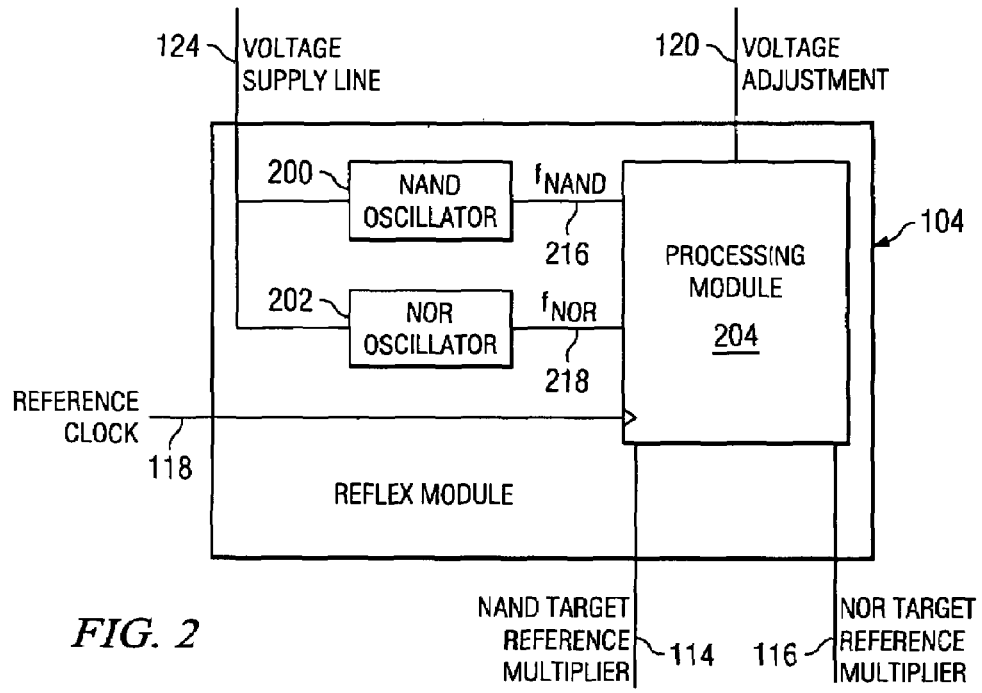
FIG. 2 illustrates an example of reflex module 104 (from FIG. 1) per a preferred embodiment.

FIG. 2 illustrates an example of reflex module 104 per a preferred embodiment. Reflex module 104 includes, among other things, a NAND oscillator 200, a NOR oscillator 202, and a processing module 204. Each of these components is introduced now, with additional details provided later. NAND oscillator 200 is preferably implemented because in operation the frequency produced by a NAND oscillator, designated herein as $f_{NAND}$, is more sensitive to NMOS as compared to its sensitivity to PMOS. However, any other suitable logic oscillator, or even any other suitable device capable of performing at least some functions of NAND oscillator 200 as described below, may be used. NOR oscillator 202 is preferably implemented because in operation the frequency produced by a NOR oscillator, designated herein as $f_{NOR}$, is more sensitive to PMOS as compared to its sensitivity to NMOS. Processing module 204 receives $f_{NAND}$ along a line 216 and $f_{NOR}$ along a line 218. The values of $f_{NAND}$ and $f_{NOR}$ may be in various forms such as analog or digital signals, or each as a respective count that is proportional to a respective one of these frequencies. Processing module 204 also receives the reference clock signal 118 as shown in FIG. 1. Processing module 204 also is supplied with a NAND target reference multiplier ("TRM") 114 and a NOR target reference multiplier ("TRM") 116, each of which has a function similar to that of the TRM 112 of FIG. 1. Although only two input reference signals 114 and 116 are shown, a different number of input reference signals may be used. Lastly, the operation of reflex module 104 in greater detail, including an aspect as it relates to additional adjustments in connection with memory cells in sub-chip 102, is detailed later.

Figure 3A:
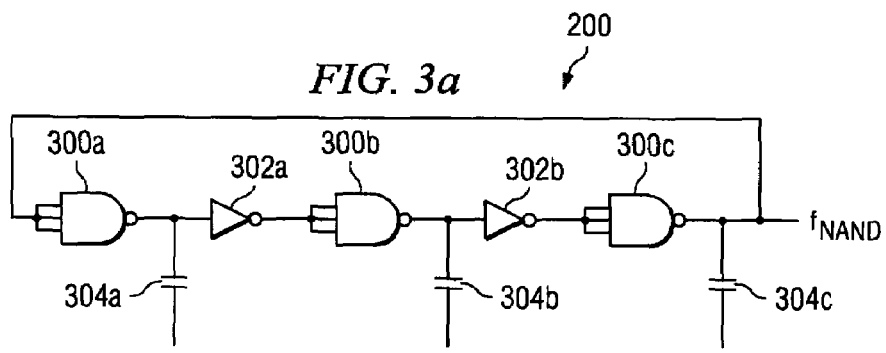
FIG. 3a illustrates a schematic of NAND oscillator 200 in detail.
Figure 3B:
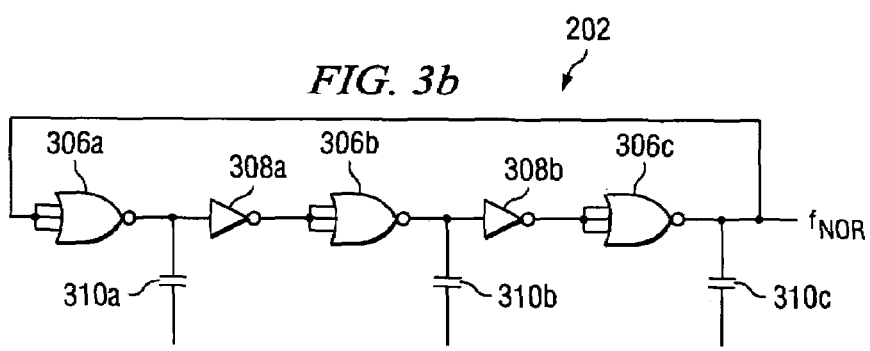
FIG. 3b illustrates a schematic of NOR oscillator 202 in detail.

FIGS. 3a and 3b illustrate respective schematics of a NAND oscillator 200 and NOR oscillator 202, introduced above in connection with FIG. 2 as tracking elements in that they provide respective frequency signals, $f_{NAND}$ and $f_{NOR}$, that in effect attempt to track the speed capability of circuit paths 98. By way of introduction, note that because NAND oscillator 200 and NOR oscillator 202 are not application-specific, they may be considered generic and may be used in any suitable device or circuit architecture. Other circuitry that performs functions similar to those of the oscillator as described below may, in some embodiments, be used instead of one or more of the oscillators.

Turning then to FIG. 3a, it illustrates a schematic of NAND oscillator 200 in greater detail. In a preferred embodiment, NAND oscillator 200 includes a feedback arrangement of NAND gates 300a, 300b, and 300c, inverters 302a and 302b, and capacitors 304a, 304b, and 304c. Each of NAND gates 300a, 300b, and 300c is a three input NAND gate, and may be constructed by one skilled in the art by stacking three n-channel transistors having their source/drain paths in series with one another to create a discharge path to ground, and with the top of that stack connected to the drains of three parallel source/drain paths of three respective p-channel transistors having their sources connected to a positive voltage source. Note that the use of such stacking also satisfies the goal set forth earlier with respect to NAND oscillator 200, that is, it is more sensitive to NMOS as compared to its sensitivity to PMOS. Note further that the use of three n-channel transistors in the discharge path to ground is preferable in that it is anticipated that any of the devices in paths 98 of sub-chip 102, or at least in critical path 96, will have no more than three stacked n-channel transistors and, thus, each NAND gate 300a, 300b, and 300c will mimic the performance of the worst case scenario of stacking of n-channel transistors in those paths. The output of NAND gate 300a is connected to capacitor 304a and also through inverter 302a to the three inputs of NAND gate 300b. Similarly, the output of NAND gate 300b is connected to capacitor 304b and also through inverter 302b to the three inputs of NAND gate 300c. The output of NAND gate 300c is connected to capacitor 304c and also fed back to the three inputs of NAND gate 300a, and it also provides the oscillator output of $f_{NAND}$. Given the described connections, a feedback loop causes NAND oscillator 200, when provided a voltage by voltage source 106, to oscillate at a certain frequency and that frequency is demonstrated in the $f_{NAND}$ signal. Although only three NAND gates 300 are shown, any number of NAND gates, inverters, capacitors, and any other suitable circuitry may be used.

Looking to FIG. 3b, it illustrates a schematic of NOR oscillator 202 in greater detail. In a preferred embodiment, NOR oscillator 202 includes a feedback arrangement of NOR gates 306a, 306b, and 306c, inverters 308a and 308b, and capacitors 310a, 310b, and 310c. Each of NOR gates 306a, 306b, and 306c is a three input NOR gate, and may be constructed by one skilled in the art by stacking three p-channel transistors having their source/drain paths in series with one another to create a charge path to a positive voltage source, and with the bottom of that stack connected to the drains of three parallel source/drain paths of three respective n-channel transistors having their sources connected to ground. Note that the use of such stacking also satisfies the goal set forth earlier with respect to NOR oscillator 202, that is, it is more sensitive to PMOS as compared to its sensitivity to NMOS. Note further that the use of three p-channel transistors in the charge path to the positive voltage source is preferable in that it is anticipated that any of the devices in paths 98 of sub-chip 102 (or at least in critical path 96) will have no more than three stacked p-channel transistors and, thus, each NOR gate 306a, 306b, and 306c will mimic the performance of the worst case scenario of stacking of p-channel transistors in those paths. The output of NOR gate 306a is connected to capacitor 310a and also through inverter 308a to the three inputs of NOR gate 306b. Similarly, the output of NOR gate 306b is connected to capacitor 310b and also through inverter 308b to the three inputs of NOR gate 306c. The output of NOR gate 306c is connected to capacitor 310c and also fed back to the three inputs of NOR gate 306a, and it also provides the oscillator output of $f_{NOR}$. Given the described connections, a feedback loop causes NOR oscillator 202, when provided a voltage by voltage source 106, to oscillate at a certain frequency, and that frequency is demonstrated in the $f_{NOR}$ signal. Although only three NOR gates 306 are shown, any number of NOR gates, inverters, capacitors, and any other suitable circuitry may be used.

Various process or environmental factors may affect both NAND oscillator 200 and NOR oscillator 202 and consequently their respective outputs $f_{NAND}$ and $f_{NOR}$, but each to a different degree. As such, NAND oscillator 200 and NOR oscillator 202 each may represent the worst-case performance scenarios of critical path 96, since NAND oscillator 200 represents the performance of critical path 96 if path 96 were comprised of primarily NMOS, and NOR oscillator 202 represents the performance of critical path 96 if path 96 were comprised of primarily PMOS. However, in reality, critical path 96 is likely to be comprised of both NMOS, PMOS, and other circuitry. Thus, the actual speed of the critical path 96 is likely to be greater than the frequencies of the NAND and NOR oscillators 200 and 202. Further in this regard, critical path 96 may be of any suitable architectural design. However, regardless of the precise design or the quality of the silicon used to fabricate critical path 96, the speed of critical path 96 will be greater than that of NAND oscillator 200 and NOR oscillator 202. This is because NAND oscillator 200 is represented by the arrangement of NMOS-sensitive NAND gates shown in FIG. 3a, thus representing one possible worst-case performance scenario. Similarly, NOR oscillator 202 is represented by the arrangement of PMOS-sensitive NOR gates shown in FIG. 3b, thus representing the other possible worst-case performance scenario. In contrast, critical path 96, in most practical cases, may likely be a combination of NMOS, PMOS, and/or other types of circuitry, thus making critical path 96 less sensitive to environmental influences than NAND and NOR oscillators 200 and 202. As such, the actual performance of critical path 96 is better than both of the worst-case performance scenarios given by NAND oscillator 200 and NOR oscillator 202. Thus, even if critical path 96 is comprised of NMOS and no PMOS, the performance of critical path 96 will be accurately predicted by the NAND oscillator 200. Conversely, if critical path 96 is comprised of PMOS and no NMOS, the performance of critical path 96 will be accurately predicted by the NOR oscillator 202. The same concepts would apply if other tracking elements were used instead of one or more of the oscillators.

Given the indications permitted by the tracking elements, preferably implemented as NAND oscillator 200 and NOR oscillator 202, then in the preferred embodiments, as further detailed in connection with above-incorporated U.S. patent application Ser. No. 11/045,222, processing module 204 of reflex module 104 will cause a downward adjustment in voltage source 106 if both oscillators 200 and 202 show a speed greater than that desired of sub-chip 102, where the desired speed is determined by scaling the reference clock with one or more multipliers. Conversely, processing module 204 of reflex module 104 will cause an upward adjustment in voltage source 106 if one or the other of oscillators 200 and 202 shows a speed less than that desired of sub-chip 102. In any case, therefore, there is a dynamic adjustment to voltage and the adjusted voltage may be applied to various of the circuit paths 98 (including critical path 96) in sub-chip 102.

Figure 4:
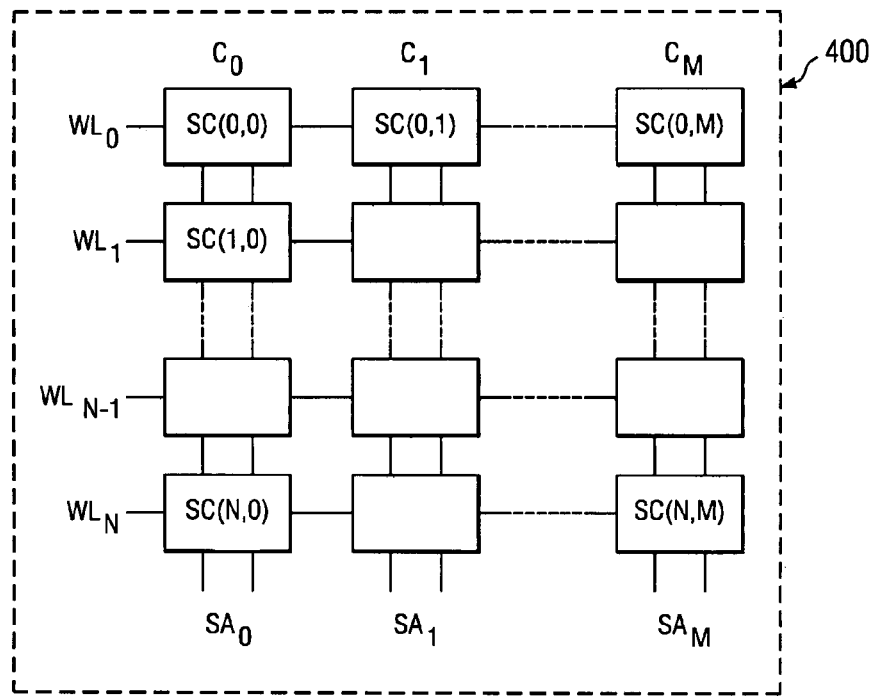
FIG. 4 illustrates a memory configuration 400.

Given that the above demonstrates that voltage levels may be dynamically adjusted to circuit paths 98, recall that it was earlier noted that such paths may include paths in a memory, and more particularly in an SRAM. In another aspect of the preferred embodiment, however, it is recognized that by merely applying the dynamically adjusted voltage globally to all paths within circuit paths 98, that would include both the periphery and the cells of the SRAM. In such a case, if the dynamic voltage is adjusted downward the voltage difference applied across the SRAM is reduced and the cell may no longer have a satisfactory trip voltage margin, or $V_{trip}$, which recall was discussed earlier in the Background Of The Invention section of this document. Since such an approach may well call into question the SRAM's proper operation, the preferred embodiments provide for a selectable additional adjustment to the dynamically adjusted voltage, which is the focus of the remainder of this document To facilitate a better understanding of certain of the considerations in connection with SRAM and the preferred embodiments, FIG. 4 illustrates a memory configuration 400 which in its block form shown in FIG. 4 is typical of that in the art, but which as detailed later also includes aspects that improve its operation in connection with the preferred embodiments. Thus, the following discussion first describes the more general known aspects for sake of introduction and to facilitate the later discussion of the improvements in connection with the inventive scope. Memory configuration 400 is generally connected in an array form, thereby presenting a number of wordlines $WL_0$ through $WL_N$ each aligned in the illustrated x-dimension and a number of columns $C_0$ through $C_M$ each aligned in the illustrated y-dimension. At the intersection of each wordline and column is a storage cell abbreviated SC, and some of which are shown by way of example as having a coordinate (WL,C) such that the first element specifies the wordline corresponding to the storage cell and the second element specifies the column corresponding to the storage cell. The array nature of memory configuration 400 permits either writing data to, or reading data from, a storage cell on a wordline basis. In other words, one or more storage cells along the same wordine may be accessed (i.e., for either read or write) at a time.

Since memory configuration 400 is representative of an SRAM, then for each column a pair of conductors extends between storage cells along the column, where these conductors are referred to in the art as bitlines. The bitlines permit either reading or writing of a cell connected to a given pair of bitlines, as introduced generally here and as detailed further in connection with FIG. 5, below. Turning first to an introduction of these operations, for purposes of writing data to the cell, one of the two bitlines is pulled down with some external write circuit (not shown in FIG. 4), and then the wordline of the cell is asserted to write the data state to the cell in response to the pulled down bitline. As detailed later, the external write circuit typically includes a transistor that is appropriately sized so as to discharge one of the two storage nodes in the cell so as to perform this write, and the preferred embodiments are directed in part to ensure this operation properly occurs even if there is or has been a dynamic adjustment in the system voltage. For purposes of reading data from the cell, the two bitlines for a given cell provide two respective signals that are compared to one another to determine the data stored at a cell along a selected one of the wordlines. More specifically, the signals provided by each bitline pair in FIG. 4 are connected to corresponding sense amplifier circuits, shown as $SA_0$ through $SA_M$. For purposes of discussion, the subscript of each of the sense amplifier circuits matches that of the column to which it corresponds. Each of sense amplifier circuits $SA_0$ through $SA_M$ includes circuitry for "sensing" the differential voltage along the paired bitlines by amplifying it. Typically, the differential voltage is either amplified to a full scale signal, or there may be stages which amplify the current drive to some level having a lesser signal swing then a full scale signal. Note also that FIG. 4 illustrates each sense amplifier circuit as connected only to a single pair of corresponding column conductors by way of example, whereas other variations may exist in the correlation between column conductors and sense amplifier circuits.

Figure 5:
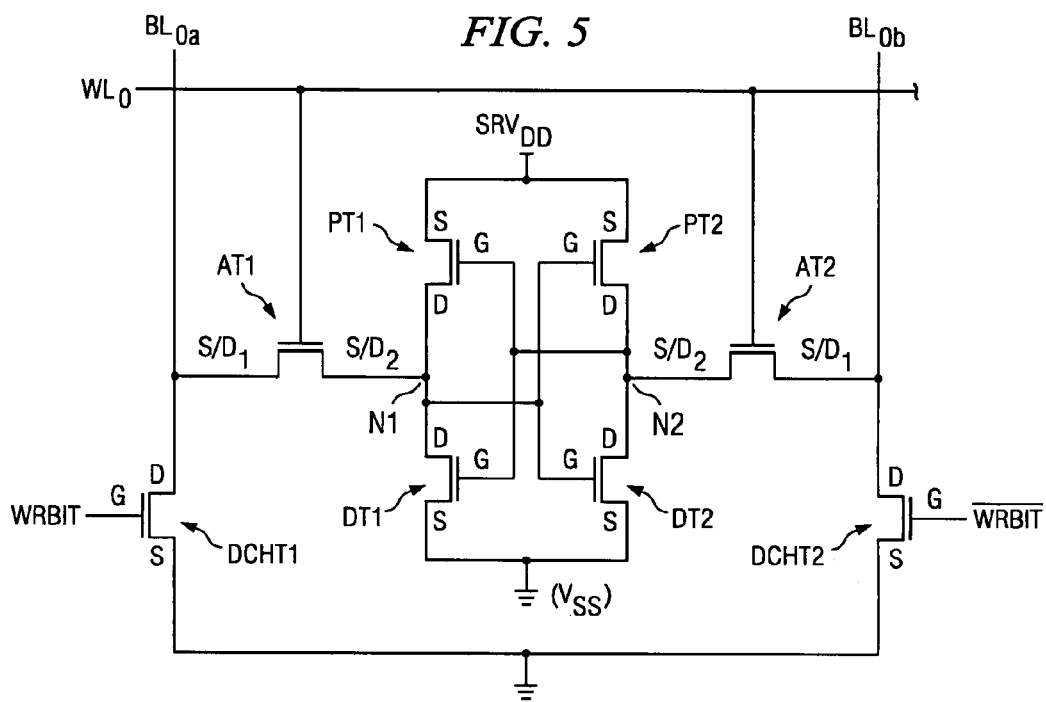
FIG. 5 illustrates a cell from memory configuration as well as examples of the discharge transistors in the periphery of the cell array.

FIG. 5 illustrates a schematic of storage cell SC(0,0) from configuration 400 in greater detail, with it understood that each of the remaining storage cells of FIG. 4 is constructed in the same manner (yet, of course, connected to a different one of either a wordline or pair of bitlines, or both). At the outset, note for further discussion that the bitlines from column 0 of FIG. 4 are designated in FIG. 5 with the abbreviation "$BL_0$", and are further distinguished from one another by adding one of the letters "a" and "b" to the subscripts for these conductors. Storage cell SC(0,0) is what is referred to in the art as a 6T cell, meaning it includes six transistors. For purposes of presenting a basis for a functional description below, each of these transistors is further referred to by combining the word "transistor" with a descriptive term relating to the function of the transistor. In this regard, storage cell SC(0,0) includes two access transistors AT1 and AT2, two pull-up transistors PT1 and PT2, and two drive transistors DT1 and DT2. Note that the functional terms "access" and "drive" are chosen to facilitate an understanding by one skilled in the art but not by way of limitation, as other terms are also sometimes used in the art for such transistors. For example, the access transistor are sometimes referred to as passgate transistors. As another example, the drive transistors are sometimes referred to as pull-down transistors. In any event, from the additional details including the connection and function of each of these transistors as provided below, one skilled in the art will appreciate those transistors that are the subject of the present inventive embodiments, regardless of the particular terminology directed to such transistors.

Turning first to the two access transistors AT1 and AT2 in FIG. 5, both are n-channel transistors and are connected in a symmetric manner. Accordingly, the following discussion first addresses access transistor AT1 followed by a brief discussion of the similar nature of access transistor AT2. The gate of access transistor AT1 is connected to wordline $WL_0$. As a transistor, access transistor AT1 has two typically symmetric regions that are commonly characterized as source and drain regions. Specifically, often for a transistor, one of these regions is referred to as the source while the other is the drain, based on the transistor conductivity type and the relative potentials connected to those regions. However, in an implementation such as storage cell SC(0,0), the potential at either region may swing relative to the other and, thus, a given region may in one instance be considered the source while in another instance may be considered the drain. For this reason, from this point forward and also for the remaining comparable transistors discussed in this document each region is referred to as a source/drain. Given that convention, access transistor AT1 has two source/drains $S/D_1$ and $S/D_2$. Source/drain $S/D_1$ is connected to bitline $BL_{0a}$, and source/drain $S/D_2$ is connected to a node N1. Looking now to access transistor AT2, its gate is also connected to wordline $WL_0$. A first source/drain $S/D_1$ of access transistor AT2 is connected to bitline $BL_{0b}$, and a second source/drain $S/D_2$ of access transistor AT2 is connected to a node N2.

Looking now to pull-up transistors PT1 and PT2 in FIG. 5, both are p-channel transistors and connected in a symmetric manner. Turning first to pull-up transistor PT1, its source is connected to a relatively high voltage, which is shown as $SRV_{DD}$; note this is in contract to the designation $V_{DD}$ as is customary in the transistor art, where recall that $SRV_{DD}$ is intended to demonstrate the voltage that is provided and may be dynamically adjusted at times by reflex module 104 as described earlier. The drain of pull-up transistor PT1 is connected to node N1. Lastly, the gate of pull-up transistor PT1 is connected to two other points. First, the gate is connected to the gate of drive transistor DT1. Second, the gate is connected to node N2. Looking now to pull-up transistor PT2, its source is connected to $SRV_{DD}$ and its drain is connected to node N2. The gate of pull-up transistor PT2 is connected to the gate of drive transistor DT2 and to node N1.

With reference to drive transistors DT1 and DT2 in FIG. 5, both are n-channel transistors and also are connected in a symmetric manner. Turning first to drive transistor DT1, its source is connected to a potential that is low relative to $SRV_{DD}$, where this potential may be referred to herein as $V_{SS}$ as also shown in parenthesis in FIG. 5, and in the present example $V_{SS}$ is shown as a potential equal to ground. The drain of drive transistor DT1 is connected to node N1. The gate of drive transistor DT1, as mentioned above, is connected to the gate of pull-up transistor PT1 and to node N2. Looking now to drive transistor DT2, its source is connected to $V_{SS}$ (e.g., ground) and its drain is connected to node N2. The gate of drive transistor DT2 is connected to the gate of pull-up transistor PT2 and to node N1.

Having described storage cell SC(0,0) in FIG. 5, note that FIG. 5 also illustrates two discharge transistors DCHT1 and DCHT2 that are not part of the cell but instead are part of the periphery circuitry for memory configuration 400 and are used, as detailed below, to write data to that cell as well as other cells connected to bitlines $BL_{0a}$ and $BL_{0b}$. Preferably discharge transistors DCHT1 and DCHT2 are n-channel transistors, each with a source connected to ground (or $V_{SS}$) and a drain connected to a respective one of bitlines $BL_{0a}$ and $BL_{0b}$. A bit write signal WRBIT is connected to the gate of discharge transistor DCHT1 and the complement of that signal (i.e., $\overline{WRBIT}$) is connected to the gate of discharge transistor DCHT2. Lastly, note that discharge transistors DCHT1 and DCHT2 are shown by way of example in connection with the bitlines $BL_{0a}$ and $BL_{0b}$ associated with cell SC(0,0) in column 0 of memory configuration 400; thus, one skilled in the art will appreciate that comparable discharge transistors will be used for each other pair of bitlines in columns $C_1$ through $C_M$ of that configuration.

In operation of storage cell SC(0,0) of FIG. 5, a binary value may be either written to, or read from, the cell. When power is first applied to storage cell SC(0,0), it will assume one of two binary states, with the state being understood as random at this initial point of operation. The cases of either a subsequent write of data to storage cell SC(0,0), or a read from storage cell SC(0,0), are each discussed separately below.

A write to storage cell SC(0,0) is as follows. First, one of bitlines $BL_{0a}$ and $BL_{0b}$ is pulled low by asserting WRBIT to a value that enables one or the other of discharge transistors DCHT1 and DCHT2, thereby connecting the drain of the enabled discharge transistor to ground; in this regard, note that the term "enable" is intended as known in the art to indicate that a sufficient source-to-gate potential is provided such that the transistor channel fully conducts. For an example, assume that WRBIT is asserted high (at a voltage of $SRV_{DD}$), thereby enabling discharge transistor DCHT1 so that bitline $BL_{0a}$ is pulled low; also, because the complement of WRBIT (i.e., $\overline{WRBIT}$) is thus low, then discharge transistor DCHT2 is not enabled and, thus, bitline $BL_{0b}$ remains high. Next, wordline $WL_0$ is asserted high which enables access transistors AT1 and AT2 by placing a high signal (at a voltage of $SRV_{DD}$) at the gates of those transistors. Additionally, although other storage cells are not shown in FIG. 5, note that other cells which likewise have access transistors connected to wordline $WL_0$ are concurrently enabled for writing due to the enabling signal on wordline $WL_0$. Retuning to storage cell SC(0,0), the enabling of access transistor AT1 connects node N1 to the low potential and discharge path at bitline $BL_{0a}$. Note that the n-channel access transistor AT1 and discharge transistor DCHT1 have greater drive capabilities than the p-channel pull-up transistor PT1; as a result, the n-channel transistors are able to overcome the charge at this point provided by p-channel pull-up transistor PT1 to node N1 and, thus, node N1 is pulled low (i.e., to the ground at the source of discharge transistor DCHT1) by these n-channel transistors. With node N1 low, pull-up transistor PT2 is enabled and drive transistor DT2 is disabled, in which case pull-up transistor PT2 brings node N2 to $SRV_{DD}$, which is further connected to the gate of drive transistor DT1 and, therefore, enables drive transistor DT1. Since drive transistor DT1 is enabled, node N1 continues to be pulled to ground and, thus, node N1 is maintained at ground even after wordline $WL_0$ is no longer enabling to access transistors AT1 and AT2. Consequently, storage cell SC(0,0) will maintain the stored data state until it is thereafter changed by a subsequent write operation.

A read from storage cell SC(0,0) is as follows. At the outset, for the sake of the following example, assume that the following read occurs after the above-described write and, thus, following that write node N1 is maintained low while node N2 is maintained high. Turning to the read operation, first both bitlines $BL_{0a}$ and $BL_{0b}$ are precharged high. Second, wordline $WL_0$ is enabled, once again enabling access transistors AT1 and AT2. Next, the low signal at node N1 is effectively transferred to $BL_{0a}$; more particularly, the combination of the enabled access transistor AT1 and the enabled drive transistor DT1 pulls the precharged voltage of bitline $BL_{0a}$ low. At the same time, however, the precharged voltage at bitline $BL_{0b}$ is not disturbed. Consequently, sense amplifier $SA_0$ (see FIG. 4) next amplifies the differential voltage between bitlines $BL_{0a}$ and $BL_{0b}$, thereby providing a voltage which based on the relative values between those bitlines represents a binary state for storage cell SC(0,0).

In connection with the preferred embodiments, the present inventors have observed a possible limitation of the preceding aspects, and provide below an additional aspect to overcome this limitation. Particularly, the preceding has demonstrated that reflex module 104 may dynamically adjust $SRV_{DD}$, and that voltage may be applied to circuit paths 98, which include various different circuits and also include memory in the form of SRAM memory configuration 400 of FIGS. 4 and 5. However, given the various preceding illustrations and description, the above-introduced aspects with respect to the SRAM $V_{trip}$ may be further appreciated. Particularly, recall that the $V_{trip}$ must be sufficient to ensure proper operation of the SRAM. This margin is demonstrated in FIG. 5 in relation to the voltage difference across the source of the pull-up transistors relative to that at the source of the drive transistors, namely, between $SRV_{DD}$ and ground in that example. Particularly, $V_{trip}$ is the minimum positive (i.e., greater than or equal to ground) voltage required at the sources of discharge transistors DCHT1 and DCHT2 to facilitate a trip of the state of the cell when operating properly, given that a dynamically adjustable voltage is used for $SRV_{DD}$ and where $SRV_{DD}$ is provided to the sources of pull-up transistors PT1 and PT2 and is also used as a high voltage for asserting a wordline (e.g., $WL_0$) or a write enable signal WRBIT (or its complement). However, with the dynamic adjustment of $SRV_{DD}$ and given the already relatively low nominal voltage in contemporary applications (e.g., 1.08 volts at the cell transistors), then the $V_{trip}$ may in some instances cross below ground, in which case the cell may not properly change its data state when operated to do so because in fact the sources of the discharge transistors are connected to ground. Indeed, since $SRV_{DD}$ is adjusted by reflex module 104 based on its tracking elements as described above, then without further intervention there is theoretically the chance that $SRV_{DD}$ would be lowered to a level that does not leave operating room for this margin. With the recognition of this issue by the present inventors, the preferred embodiments provide additional aspects to reduce the possibility of such erroneous operations.

Figure 6:
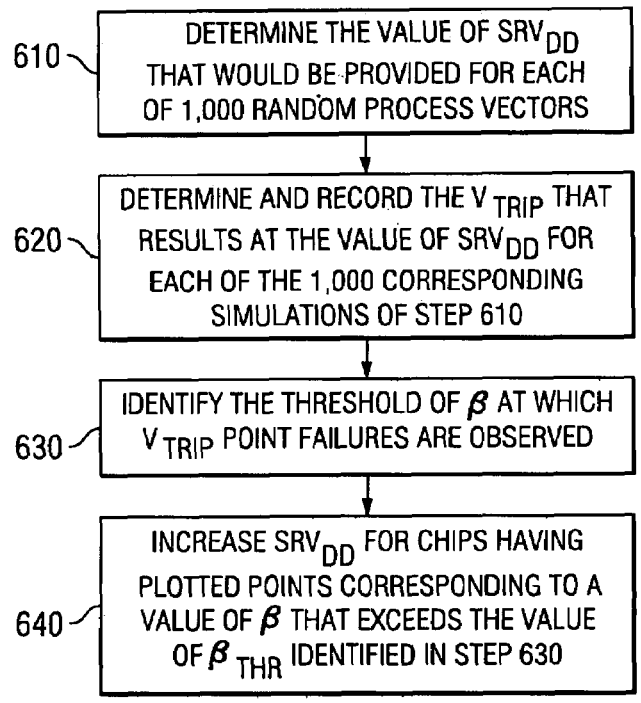
FIG. 6 illustrates a flowchart of a method that demonstrates a set of analyses and a resultant action for purposes of further adjusting a dynamically adjusted voltage in response to devices predicted by simulation to have a beta value above a threshold.

FIG. 6 illustrates a flowchart of a method 600 that demonstrates a set of analyses and a resultant action by way of introduction to an additional depiction of the preferred embodiments as later illustrated in FIG. 9. Looking first then to FIG. 6, method 600 illustrates and starts with a step 610. In step 610, for a group of chips in the form of chip 100 from FIG. 1, step 610 determines, such as from simulation, the value of $SRV_{DD}$ that would be provided per the approach described above in connection with FIGS. 1 through 3b for each of 1,000 random process vectors. Thus, such random process vectors may in simulation consider various different contingencies that can occur in the manufacturing process for the group of chips, and based on those processes the simulation determines for each what the resultant value of $SRV_{DD}$ would be for a desired operational speed, again where there is a downward adjustment in voltage source 106 if both oscillators 200 and 202 demonstrate a speed greater than that desired of sub-chip 102 during the simulation or there is an upward adjustment in voltage source 106 if either of oscillators 200 and 202 demonstrates a speed less than that desired of sub-chip 102 during the simulation. Next, method 600 continues from step 610 to step 620.

Figure 7:
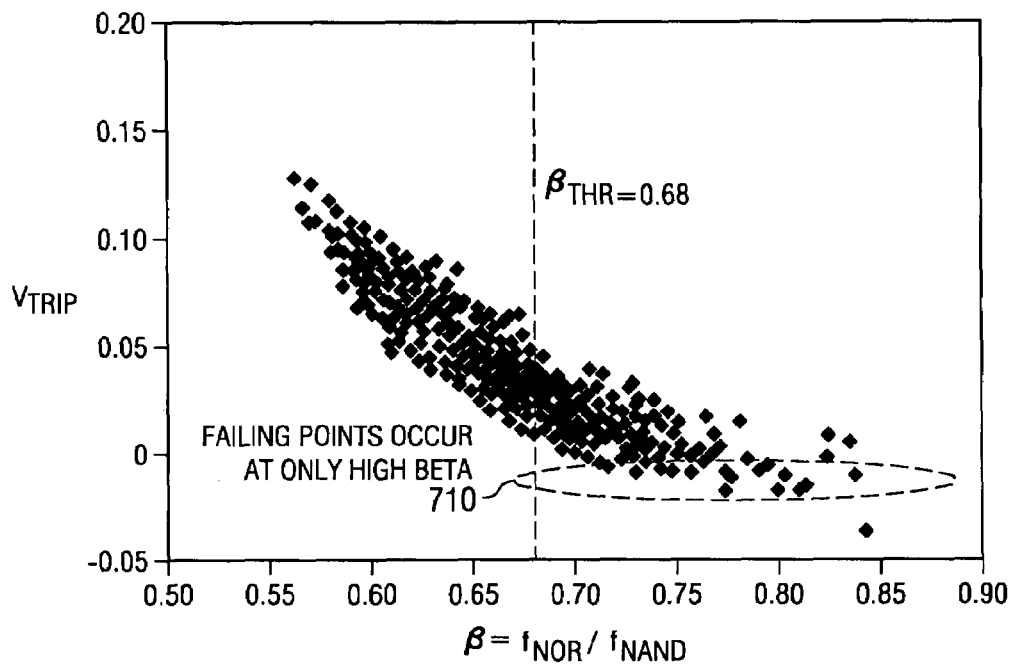
FIG. 7 illustrates a plot that reflects the recordation of step 620 from FIG. 6.

Step 620 determines and records the $V_{trip}$ that results at the value of $SRV_{DD}$ determined for each of the 1,000 corresponding simulations of step 610. The $V_{trip}$ determination of this step may be achieved using various simulations, such as SPICE simulation or during silicon characterization by ways of example. Thus, for each of the 1,000 step 610 simulations, the value of $SRV_{DD}$ for that voltage is applied to the sources of pull-up transistors PT1 and PT2 and is also used as a high voltage for asserting a wordline (e.g., $WL_0$) and a write enable signal WRBIT (or its complement), and the source voltage then needed at the enabled one of the periphery discharge transistors (e.g., DCHT1 or DCHT2) is determined, with that determined voltage being the value of $V_{trip}$ for the given simulation. Further, and for reasons demonstrated below, the recordation of the $V_{trip}$ is plotted in relation to the ratio of the frequency provided by NOR oscillator 202 to the frequency provided by NAND oscillator 200. To further demonstrate this step, FIG. 7 illustrates a plot that reflects the recordation of step 620. Particularly, FIG. 7 illustrates along its vertical axis the value of $V_{trip}$, with that value further de-rated (i.e., reduced) by a certain margin to account for possible process variations. Further, FIG. 7 illustrates on its horizontal axis what is the NOR/NAND oscillator frequency ratio (shown as $f_{NOR}/f_{NAND}$). The points of FIG. 7 assist in the explanation of the desirability of step

620. Specifically, as may be seen in FIG. 7, a majority of the plotted points, each corresponding to a $V_{trip}$ value, are above the horizontal zero axis for $V_{trip}$, although some points as shown within the oval 710 are below that axis. Moreover, recall from the earlier explanation of $V_{trip}$, a $V_{trip}$ below 0 volts indicates a likely failure in the operation of an SRAM. Thus, it may be appreciated from FIG. 7 that in some instances of the figure, there are indeed indications of likely failures, that is, for those points in oval 710. Next, method 600 continues from step 620 to step 630.

Step 630 identifies a threshold for use with the preferred embodiments, as is now further explored. Importantly, the present inventors demonstrate in the plot of FIG. 7 that the indications of likely failures are grouped toward one side of the figure, that is, a correlation is demonstrated that the likelihood of failure (i.e., subzero $V_{trip}$) has a strong correlation to an increase in the ratio NOR/NAND oscillator frequency ratio, and for sake of reference let this ratio be indicated as β. In other words, as seen from FIG. 7, at a ratio value of β less than approximately 0.69, there are no predicted failures. However, above the ratio value of β equal to approximately 0.69, the failures increase. Thus, in step 630, the threshold of β at which $V_{trip}$ point failures are observed is identified, where let this threshold hereafter be indicated as $β_{THR}$. In the example of FIG. 7, therefore, $β_{THR}$=0.69. Further, as shown below, in the preferred embodiment additional corrective measures are made to reduce the chance of failure for those points having a β greater than this threshold and, thus, for sake of being conservative, $β_{THR}$ might be selected as slightly lower so as to capture all plotted and any nearby possible failures, such as setting $β_{THR}$=0.68 in the present example. Accordingly, in FIG. 7 a dashed line is shown for $β_{THR}$=0.68, where the preferred embodiment improves the chances of successful operation for circuits corresponding to those plotted points.

Method 600 concludes with a step 640. Step 640 indicates that $SRV_{DD}$ is increased for chips having plotted points corresponding to a value of β that exceeds the value of $β_{THR}$ identified in step 630. In other words, therefore, steps 610, 620, and 630 have demonstrated, as also depicted in FIG. 7, that when supplying a dynamic voltage level, $SRV_{DD}$, in response to either a PMOS sensitive measure (e.g., NOR oscillator 202) or an NMOS sensitive measure (e.g., NAND oscillator 200), the value of $SRV_{DD}$ may be reduced to a level that does not jeopardize an operationally-adequate $V_{trip}$. As a result, for those chips with an SRAM that are susceptible to failure due to the subzero $V_{trip}$, that is, for those with a value of β that exceeds the value of $β_{THR}$ identified in step 630, step 640 therefore increases $SRV_{DD}$ by an additional safety margin or offset of a voltage, herein referred to as $SRV_{A}$, in order to provide a greater amount of voltage so as to permit an adequate $V_{trip}$. In other words, an offset delta is added to the system voltage $SRV_{DD}$ in response to the beta of the chip. This delta voltage adder may be achieved in various manners, with one preferred approach discussed later in connection with FIG. 9.

In a preferred embodiment, $SRV_{A}$ is selectively added to the system voltage $SRV_{DD}$ in response to the β of the chip and, more particularly, preferably the magnitude of $SRV_{A}$ is increased to an extent that is dependent on the extent to which the chip's particular β exceeds the value of $β_{THR}$ identified in step 630. Thus, in one approach of a preferred embodiment, $SRV_{A}$ may relate linearly in this respect according to the following Equation 1:

$$SRV_{A}=(β-β_{THR})*V_{F} \qquad \text{Equation 1}$$

In Equation 1, $SRV_{A}$ is determined from the chip's particular β, which may be evaluated by testing or on-chip functionality as demonstrated later, and the value of $β_{THR}$ has been identified in method 600 as discussed above. Finally, $V_{F}$ is a voltage factor that may be determined by one skilled in the art in various manners, including empirically or during silicon characterization, which therefore provide a multiplier times which the beta difference between the parenthesis is multiplied to determine $SRV_{A}$. For example, in certain contemporary applications, a $V_{F}$ value of approximately $V_{F}$=0.35 has found favor. In this regard, assume in an example that $β_{THR}$=0.68 as indicated above and assume further that for a particular chip under a particular set of conditions that its β=0.75. As a result, then for each instance that reflex module 104 provides a control signal so that voltage source 106 provides $SRV_{DD}$, that value of $SRV_{DD}$ will be increased by substituting these values into Equation 1, as shown in the following Equation 2:

$$SRV_{A}=(0.75-0.68)*0.35=0.0245 \qquad \text{Equation 2}$$

Given Equation 2, then $SRV_{DD}$ in this example is increased by 0.0245 volts, thereby seeking to provide a voltage for that chip so that its SRAM has sufficient $V_{trip}$.

Figure 8:
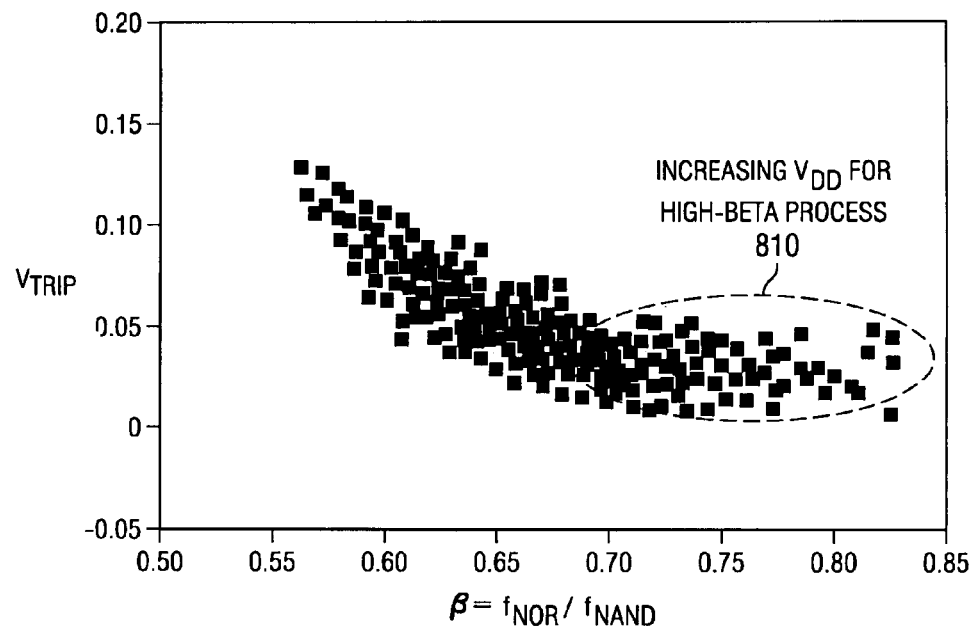
FIG. 8 illustrates the plot of FIG. 7 after an adjustment is made to the dynamically adjustable system voltage.

To further demonstrate the effects of the preceding, FIG. 8 illustrates the plot of FIG. 7 after an adjustment is made to $SRV_{DD}$ per the above. Thus, like FIG. 7, FIG. 8 illustrates along its vertical axis the $V_{trip}$ and on its horizontal axis it plots what is the NOR/NAND oscillator frequency ratio (shown as $f_{NOR}/f_{NAND}$). However, in this case and by virtue of the preceding as shown by way of example with Equation 1, for each plotted point with a β greater than $β_{THR}$=0.68, then there is an upward adjustment in $SRV_{DD}$ by an offset of $SRV_{A}$. As a result, and as shown in FIG. 8, there are no longer any plotted points below the unacceptable $V_{trip}$ of zero, where as shown in the oval 810 each of those samples, even with a β greater than $β_{THR}$=0.68, have an acceptable $V_{trip}$. In other words, each of the points, corresponding to the predicted behavior of the 1,000 chips centered about the bell curve for expected process parameters, represents a chip with an SRAM wherein the SRAM is expected to operate satisfactorily with the ability of reflex module 104 to make efficiency adjustments in power with those adjustments further supplemented by $SRV_{A}$. Moreover, and as further explored later, note that the preceding causes $SRV_{A}$ to be used only for those chips that have β greater than $β_{THR}$=0.68. Accordingly, for the chips with β less than $β_{THR}$=0.68, which represents a majority of the statistical results as shown in FIG. 7, no adjustment is made to $SRV_{DD}$ and, thus, for those chips $SRV_{DD}$ is based solely on one or both of NAND oscillator 200 and NOR oscillator 202, rather than in response to a ratio of the two.

Figure 9:
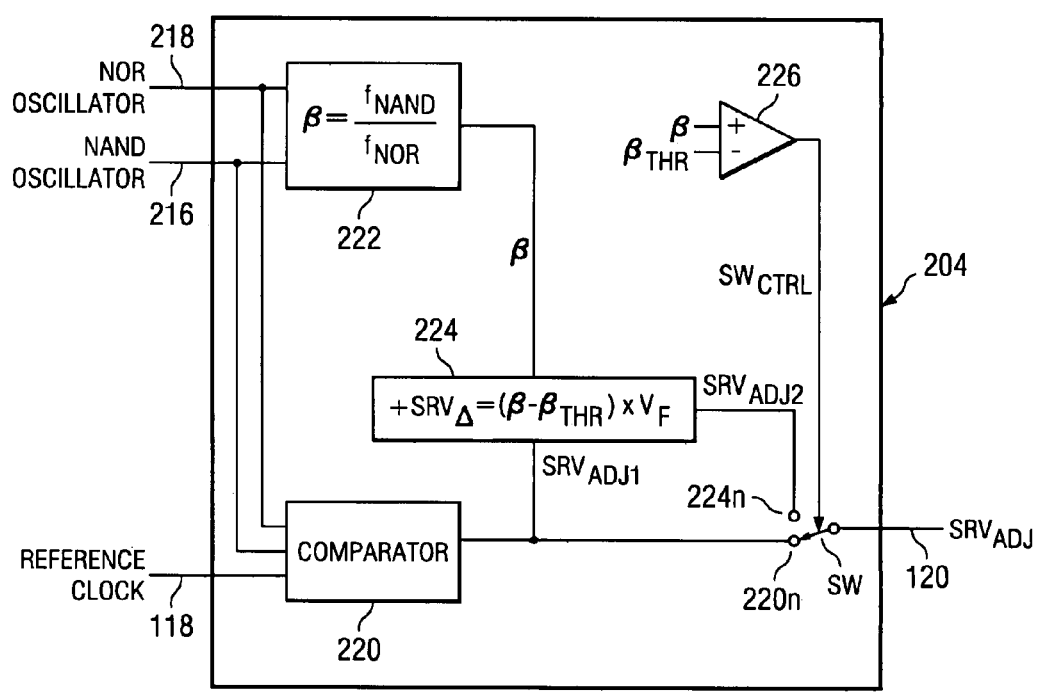
FIG. 9 illustrates a functional diagram of processing module 204 from FIG. 2.

FIG. 9 illustrates a functional diagram of processing module 204, which recall was illustrated in block form and described above in connection with FIG. 2. By way of introduction, note that certain of the functions of FIG. 9 may be implemented in various forms, such as through hardware, software, and hard-wiring certain values into the chip that includes module 204, or through still other approaches as may be ascertained by one skilled in the art. Module 204 receives as inputs the reference clock at line 118 and the $f_{NOR}$ and $f_{NAND}$ frequency signals at lines 218 and 216, respectively; all of these inputs are connected to a comparator 220, and $f_{NOR}$ and $f_{NAND}$ are also connected to a beta-determining block 222. Beta-determining block 222 outputs the determined value of β as an input to a +$SRV_{A}$ block 224, and in the preferred embodiment this value is also in effect functionally provided as a one time input to a comparator 226, which receives as a second input the value $\beta_{THR}$ that may be ascertained from step 630 detailed above in connection with FIG. 6. $\beta_{THR}$ may be provided to block 224 in this regard in various ways, such as stated earlier as a programmable value or as a hardwired value (e.g., through the use of fuses, as known in the art for providing fixed data to a circuit). The output of comparator 226 provides a switch control signal $SW_{CTRL}$ to a switch SW, and switch SW may select from the output of either $+SRV_A$ block 224 or comparator 220, with the selection then provided as the signal $SRV_{ADJ}$ at output 120 of processing module 204, which recall from FIG. 1 is then used to control voltage source 106.

The operation of processing module 204 is now discussed, and its various details should be readily appreciated by one skilled in the art given the many teachings set forth above in this document. To better appreciate this discussion, first below is the instance of operation as it will result for any chip 100 where $\beta$ is less than or equal to $\beta_{THR}$, that is, for those devices having a plot on FIG. 7 at or to the left of the vertical dotted line at $\beta_{THR}=0.68$. Thereafter is the instance of operation as it will result for any chip 100 where $\beta$ is greater than $\beta_{THR}$, that is, for those devices having a plot on FIG. 7 to the right of the dotted line.

Looking to the first instance described immediately above, comparator 220 performs the functionality discussed earlier in connection with FIG. 2, namely, it compares $f_{NOR}$ and $f_{NAND}$ to the frequency of the reference clock, subject also to any multipliers. As stated earlier, if both $f_{NOR}$ and $f_{NAND}$ are faster than the reference clock, subject to multipliers if any, then as now shown in FIG. 9 comparator 220 asserts $SRV_{ADJ1}$ to a level that, if output by module 204, causes voltage source 106 to decrease $SRV_{DD}$. Conversely, if either of $f_{NOR}$ and $f_{NAND}$ are slower than the reference clock, subject to multipliers if any, then as now shown in FIG. 9 comparator 220 asserts $SRV_{ADJ1}$ to a level that, if output by module 204, causes voltage source 106 to increase $SRV_{DD}$. Given the value of $SRV_{ADJ1}$ as provided by comparator 220, note that $SRV_{ADJ1}$ is connected to a node 220n that is only selected if switch SW is controlled to contact that node. Further in this regard, in this first instance switch SW defaults to a downward position so that indeed $SRV_{ADJ1}$ at node 220n is connected to and provides the value of signal $SRV_{ADJ}$ to voltage adjustment line 120. In this case, therefore, $SRV_{ADJ1}$ may be a same adjustment as is discussed in the above-incorporated patent application Ser. No. 11/045,222 or it may be of other types of adjustments such as is discussed in the above-incorporated patent application Ser. No. 11/139,452 or still others.

Looking now to the second instance of operation, note that again comparator 220 operates as described above in the first instance, but note that $SRV_{ADJ1}$ is also connected as an input to $+SRV_A$ block 224. In block 224, the value of $SRV_A$ is added to $SRV_{ADJ1}$, thereby providing an output value of $SRV_{ADJ2}$ at node 224n, as is now explored. Particularly, block 222, comparator 226, and switch SW permit an additional modification to $SRV_{ADJ1}$ that is consistent with the earlier teachings in connection with Equation 1. Specifically, beta-determining block 222 determines a measure that relates $f_{NAND}$ to $f_{NOR}$ (or vice versa) that is, it relates the measure provided by the NMOS sensitive tracking element to the measure provided by the PMOS sensitive tracking element or otherwise evaluates a relationship between the NMOS sensitive tracking element measure and the PMOS sensitive tracking element measure. In a preferred embodiment, this relationship is a direct ratio of the frequency of one such tracking element to the frequency of the other such tracking element, as shown in FIG. 9 and earlier as $f_{NAND}/f_{NOR}$. However, in other embodiments alternative relationships between a measure of one tracking element to the measure of the other tracking element may be implemented. In any event, the resultant measure, designated as $\beta$, is output by block 222 from where it is used by both $+SRV_A$ block 224 and comparator 226. With respect to $+SRV_A$ block 224, it determines the value of $SRV_A$ as defined earlier in Equation 1. Thus, in the preferred embodiment, $SRV_A$ is linearly related to the amount by which $\beta$ exceeds $\beta_{THR}$, where that linear relationship is defined by $(\beta-\beta_{THR})*V_F$. Also in this regard, therefore, the value of $V_F$ also is provided before this determination to block 224, where that value also may be provided in various ways, such as a programmable value or as a hardwired value. In any event, note that the preferred linear relationship used to determine $+SRV_A$ as a function relating NMOS and PMOS sensitive circuits to one another may not be the only approach, as in other embodiments other approaches (e.g., weighting, probabilistic) may be used to relate these measures to one another, but in all events there will be an additional adjustment in $SRV_A$ where the function that relates NMOS to PMOS sensitivity indicates that such an adjustment is warranted. In any event, block 224 adds its determined value of $SRV_A$ to the value of $SRV_{ADJ1}$ that it receives as an input, with the sum being output as $SRV_{ADJ2}$. Thus, $SRV_{ADJ2}$ is $SRV_{ADJ1}+SRV_A$, meaning that $SRV_{ADJ2}$ is responsive to the comparison by comparator 220 (i.e., as provided in $SRV_{ADJ1}$), but it is also responsive to the relationship of the NMOS sensitive tracking element to the PMOS sensitive tracking element (i.e., as provided in one preferred embodiment by $\beta$, and more particularly by $(\beta-\beta_{THR})*V_F$). Still further, recalling that $\beta$ and $\beta_{THR}$ are connected as inputs to comparator 226, when $\beta$ exceeds $\beta_{THR}$, comparator 226 asserts $SW_{CTRL}$ so that switch SW moves to node 224n, that is, to the upward position in FIG. 9. As a result, the value of $SRV_{ADJ2}$ provides the value of signal $SRV_{ADJ}$ to voltage adjustment line 120. Consequently, this value of $SRV_{ADJ}=SRV_{ADJ2}$ is used to control voltage source 106, in which case voltage source 106 provides a voltage greater than just $SRV_{ADJ1}$ to sub-chip 102. As a result, to the extent that sub-chip 102 includes one or more SRAM arrays, they receive the increased voltage caused by $SRV_{ADJ2}$, thereby satisfying the $V_{trip}$ of such SRAM(s) and causing the entire chip to fall within the improved operability range illustrated earlier in FIG. 8. Lastly, note that the illustrations of FIG. 9 may be established in a preferred embodiment in a single instance per chip, such as during testing, whereby if a tested chip is detected to have a $\beta$ that exceeds $\beta_{THR}$, then switch SW may be set so that it connects to node 224n in this instance, so for all times thereafter that particular chip will operate so that $SRV_{ADJ2}$ will be used as $SRV_{ADJ}$, thereby further supplementing the system voltage due to the larger $\beta$; in an alternative embodiment, a closed loop may be implemented whereby additional structure is included on the chip and consistent with FIG. 9 and so that $\beta$ may be evaluated more than just once, with multiple repeated comparisons then of $\beta$ to $\beta_{THR}$ by comparator 226 and the operation of the $SW_{CTRL}$ signal in response to the result of that comparison.

Figure 10:
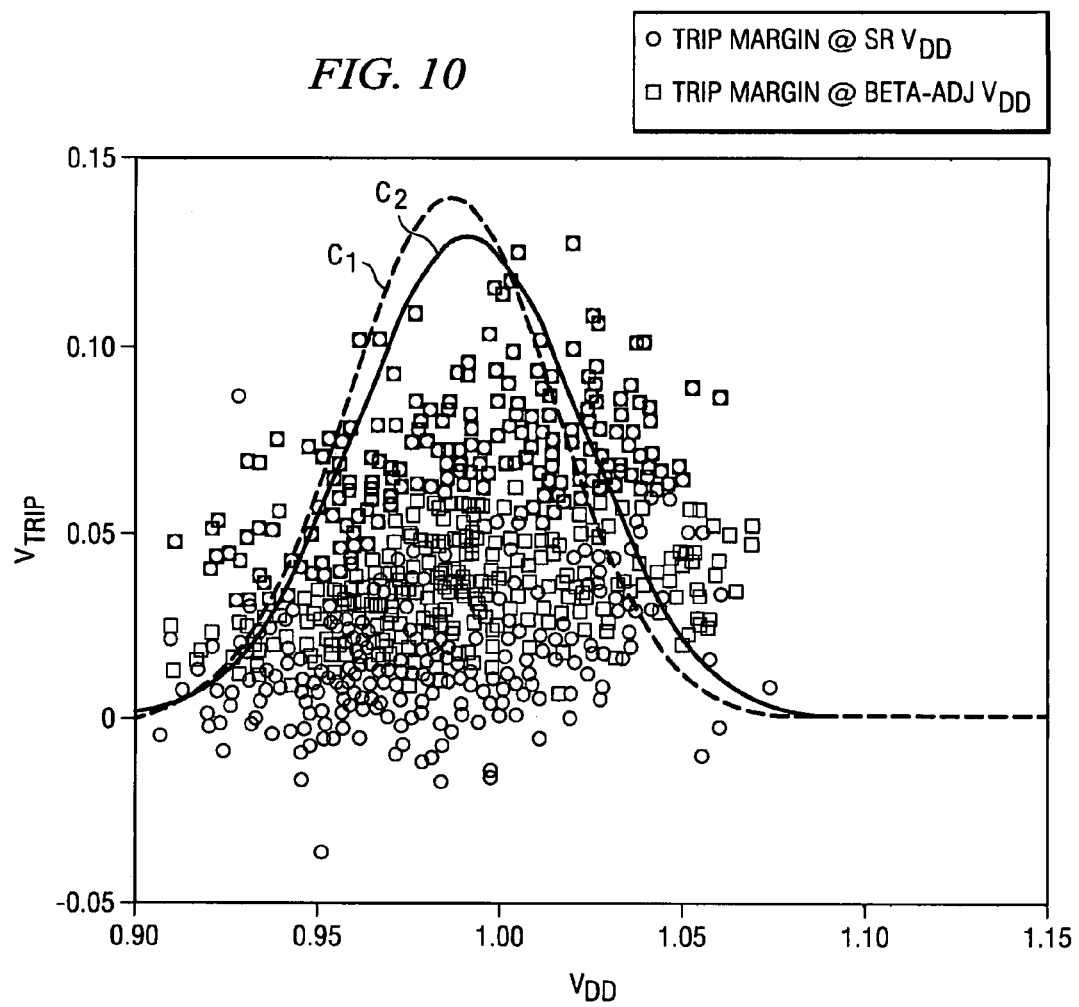
FIG. 10 again illustrates the plotted values of $V_{trip}$ of FIGS. 7 and 8 with a change in the horizontal axis to demonstrate those plots as a function of system voltage.

As a final illustration of the preceding, FIG. 10 again illustrates the plotted values of $V_{trip}$ of FIGS. 7 and 8, but in FIG. 10 the horizontal axis is different. Specifically, the FIG. 10 horizontal axis is the voltage as applied to the SRAM cell and its periphery circuitry, shown generally as $V_{DD}$. Further, the $V_{trip}$ values from FIG. 7 are shown as circles in FIG. 10 and the $V_{trip}$ values from FIG. 8 are shown as squares. Moreover, a first Guassian curve C1 corresponds to the distribution of the FIG. 7 $V_{trip}$ values shown as circles, and a second Guassian curve C2 corresponds to the distribution of the FIG. 8 $V_{trip}$ values shown as squares. From these curves, a few observations are noteworthy. First, the randomness of the plotted points, whether from FIG. 7 or from FIG. 8, demonstrates that $V_{trip}$ does not in these applications have a correlation to $V_{DD}$. Indeed, as demonstrated earlier, it is recognized in the preferred embodiment that instead $V_{trip}$ correlates to a relationship of the NMOS sensitive tracking element to the PMOS sensitive tracking element (e.g., β). Second, the slight shift or difference between curve C1 to curve C2 graphically demonstrates that with the additional voltage adjustment to $SRV_{DD}$ per the preferred embodiments, there is still considerable power savings reflected by curve C2 in that it is close to curve C1, yet the data points supporting curve C2 are all above the zero $V_{trip}$ horizontal axis and, thus, provide stable SRAM operation, whereas some of the data points supporting curve C1 fall below that zero horizontal axis and, thus, create a risk of unstable or unreliable SRAM operation.

From the above, the preferred embodiments provide an overall improvement in power management and further in view of SRAMs or other circuits that may require additional dynamic voltage considerations to ensure that the devices (e.g., cells) therein properly operate when required to do so. Additional benefits are therefore also provided by these embodiments. For example, more chips in a group of such chips may be used with a high confidence of operability, thereby improving device yield. As another example, different chips within a same group may dynamically adjust their voltage levels based on processing needs as well as environmental and process variations. Thus, efficiency, battery life, reliability and other attributes are improved. Still other examples will be ascertainable by one skilled in the art. Thus, the preceding teachings, benefits, and alternatives demonstrate the inventive scope, yet while the present embodiments have been described in detail, that inventive scope is further intended to include the variations shown herein by example and others ascertainable by one skilled in the art and as further defined by the following claims.

The invention claimed is:

1. An electronic system, comprising:
   a plurality of circuit paths, wherein each path in the plurality of circuit paths is coupled to receive a system voltage from a voltage supply;
   a first circuit for providing a first value indicating a first potential capability of operational speed of at least one path in the plurality of circuit paths;
   a second circuit for providing a second value for indicating a second potential capability of operational speed of the at least one path in the plurality of circuit paths; and
   circuitry for adjusting the system voltage, as provided by the voltage supply, in response to a relation between the first value and the second value; and
   wherein the at least one path in the plurality of paths comprises a path through a memory device.

2. The system of claim 1 and further comprising the voltage supply.

3. The system of claim 1 wherein the plurality of circuit paths, the first circuit, the second circuit, and the circuitry for adjusting are integrated in a single integrated circuit device.

4. The system of claim 1 wherein the memory device comprises a static random access memory device.

5. The system of claim 1:
   wherein the first circuit comprises a NOR oscillator; and
   wherein the second circuit comprises an NAND oscillator.

6. The system of claim 4 wherein the static random access memory device comprises a plurality of cells, and each cell comprises:
   a first p-channel transistor having a source coupled to receive the system voltage, a drain connected to a first node, and a gate connected to a second node;
   a second p-channel transistor having a source coupled to receive the system voltage, a drain connected to the second node, and a gate connected to the first node;
   a first n-channel transistor having a source coupled to receive a voltage less than the system voltage, a drain connected to the first node, and a gate connected to the gate of the first p-channel transistor; and
   a second n-channel transistor having a source coupled to receive the voltage less than the system voltage, a drain connected to the second node, and a gate connected to the gate of the second p-channel transistor.

7. The system of claim 6 and further comprising:
   a first selective discharge path coupled between the first node and the voltage less than the system voltage; and
   a second selective discharge path coupled between the second node and the voltage less than the system voltage; and
   wherein each of the first and second selective discharge paths comprises a source/drain path of at least one n-channel transistor.

8. The system of claim 1 wherein the first circuit for providing the first value is for providing a value that is more sensitive to PMOS operational speed in the system as compared to NMOS operational speed in the system.

9. The system of claim 1 wherein the second circuit for providing the second value is for providing a value that is more sensitive to NMOS operational speed in the system as compared to PMOS operational speed in the system.

10. The system of claim 1 wherein a relation between the first value and the second value comprises a ratio between the first value to the second value.

11. The system of claim 10 wherein the circuitry for adjusting adjusts in response to an extent to which the ratio exceeds a predetermined value.

12. The system of claim 10 wherein the circuitry for adjusting adjusts in response to a linear multiplier times an extent to which the ratio exceeds a predetermined value.

13. The system of claim 12 wherein the predetermined value is approximately 0.35.

14. The system of claim 10:
   wherein the first circuit comprises a NOR oscillator; and
   wherein the second circuit comprises an NAND oscillator.

15. The system of claim 10:
   wherein the plurality of circuit paths comprises circuitry for receiving and responsive to a system clock signal;
   wherein the circuitry for adjusting comprises circuitry for comparing the first value and the second value with the system clock signal as it switches over a period of time; and
   wherein the circuitry for adjusting the system voltage is further for adjusting the system voltage in response to the circuitry for comparing.

16. The system of claim 1 wherein the circuitry for adjusting the system voltage is further for adjusting the system voltage to decrease supplied power in response to a determination by a circuitry for comparing determining that the first value and the second value represent operations speeds that exceed that of a system clock signal.

17. The system of claim 1 wherein the circuitry for adjusting the system voltage is further for adjusting the system voltage to increase supplied power in response to a determination by a circuitry for comparing determining that either the first value or the second value represents an operational speed that is below that of a system clock signal.

18. The system of claim 17 wherein the circuitry for comparing comprises circuitry for comparing either a scaled version of the first value or a scaled version of the second value to the system clock signal.

19. The system of claim 16:
wherein the first circuit comprises a NOR oscillator; and
wherein the second circuit comprises an NAND oscillator.

20. The system of claim 19 wherein the relation between the first value and the second value comprises a ratio between the first value to the second value.

21. The system of claim 20 wherein the circuitry for adjusting adjusts in response to an extent to which the ratio exceeds a predetermined value.

22. The system of claim 21 wherein the circuitry for adjusting adjusts in response to a linear multiplier times an extent to which the ratio exceeds the predetermined value.

23. The system of claim 22 wherein the predetermined value is approximately 0.35.

24. A method of operating an electronic system comprising a plurality of circuit paths, wherein each path in the plurality of circuit paths is coupled to receive a system voltage from a voltage supply, the method comprising:
providing a first value indicating a first potential capability of operational speed of at least one path in the plurality of circuit paths;
providing a second value for indicating a second potential capability of operational speed of the at least one path in the plurality of circuit paths; and
adjusting the system voltage, as provided by the voltage supply, in response to a relation between the first value and the second value; and
wherein the at least one path in the plurality of paths comprises a path through a memory device.

25. The method of claim 24 wherein the memory device comprises a static random access memory device.

26. The method of claim 25:
wherein the step of providing a first value comprises providing the first value from a NOR oscillator; and
wherein the step of providing a second value comprises providing the second value from an NAND oscillator.

27. The method of claim 25 wherein the step of providing a first value is for providing a value that is more sensitive to PMOS operational speed in the system as compared to NMOS operational speed in the system.

28. The method of claim 27 wherein the step of providing a second value is for providing a value that is more sensitive to NMOS operational speed in the system as compared to PMOS operational speed in the system.

29. The method of claim 28 wherein the relation between the first value and the second value comprises a ratio between the first value to the second value.

30. The method of claim 29 wherein the step of adjusting adjusts in response to an extent to which the ratio exceeds a predetermined value.

31. The method of claim 29 wherein the step of adjusting adjusts in response to a linear multiplier times an extent to which the ratio exceeds a predetermined value.

32. The method of claim 29:
wherein the plurality of circuit paths comprises circuitry for receiving and responsive to a system clock signal;
wherein the step of adjusting comprises comparing the first value and the second value with the system clock signal as it switches over a period of time; and
wherein the step of adjusting the system voltage is further for adjusting the system voltage in response to circuitry for comparing the first and second values.

33. The method of claim 32 wherein the step of adjusting the system voltage is further for adjusting the system voltage to decrease supplied power in response to a determination by the circuitry for comparing determining that the first value and the second value represent operations speeds that exceed that of the system clock signal.

34. The method of claim 32 wherein the step of adjusting the system voltage is further for adjusting the system voltage to increase supplied power in response to a determination by the circuitry for comparing determining that either the first value or the second value represents an operational speed that is below that of the system clock signal.

35. The method of claim 24 wherein the relation between the first value and the second value comprises a ratio between the first value to the second value.

* * * * *